(12) United States Patent
Baba

(10) Patent No.: US 6,400,545 B1
(45) Date of Patent: Jun. 4, 2002

(54) FUSELESS DC-DC CONVERTER

(75) Inventor: Akira Baba, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/507,677

(22) Filed: Feb. 22, 2000

(30) Foreign Application Priority Data

Feb. 19, 1999 (JP) .............................................. 11-42417
Jan. 27, 2000 (JP) ....................................... 2000-18122

(51) Int. Cl.[7] ............................................... H02H 5/04
(52) U.S. Cl. ........................ 361/103; 361/93.8; 361/101
(58) Field of Search ............................... 361/103, 93.1, 361/93.8, 100, 101, 18; 363/15, 19, 50

(56) References Cited

U.S. PATENT DOCUMENTS

| 5,361,008 A | 11/1994 | Saijo ........................... 327/427 |
| 5,621,601 A | * 4/1997 | Fujihira et al. ............. 361/93.9 |
| 6,269,011 B1 | * 7/2001 | Ohshima ...................... 363/50 |

FOREIGN PATENT DOCUMENTS

| JP | 1-227520 | 9/1989 | .......... H03K/17/08 |
| JP | 2-266836 | 10/1990 | ............. H02J/7/10 |
| JP | 3-262209 | 11/1991 | .......... H03K/17/08 |
| JP | 4-134271 | 5/1992 | ......... G01R/19/165 |
| JP | 5-52880 | 3/1993 | ......... G01R/19/165 |
| JP | 6-27157 | 2/1994 | ......... G01R/19/165 |
| JP | 6-61432 | 3/1994 | ........... H01L/27/06 |
| JP | 6-188704 | 7/1994 | .......... H03K/17/08 |
| JP | 6-244693 | 9/1994 | .......... H03K/17/08 |
| JP | 9-145749 | 6/1997 | ........... G01R/19/00 |

* cited by examiner

*Primary Examiner*—Kim Huynh
(74) *Attorney, Agent, or Firm*—Sughrue Mion, PLLC

(57) ABSTRACT

A fuseless DC-DC converter is provided to protect a circuit from overcurrent without involvement of a protective fuse. This is accomplished by providing a load circuit in the converter that includes a first overheat self-interruption-type semiconductor switch in series between a DC power supply and a load, and a reference circuit including a second overheat self-interruption-type semiconductor switch in parrallel with the first switch, and a reference resistor with one end connected to the source of the second switch, and the other end grounded. Also included is a comparator circuit that compares the source voltage of the first switch with a reference voltage applied to the source of the second switch, and thereby determines if the circuit has overcurrent. If overcurrent is detected, the results from the comparator circuit are used by a power supply controller to deactivate the semiconductor switch.

4 Claims, 5 Drawing Sheets

FUSELESS DC-DC CONVERTER

BACKGROUND OF INVENTION

1. Field of Invention

The present invention relates to a DC-DC converter, and more particularly to a fuseless DC-DC converter which can protect a circuit from overcurrent without involvement of a protective fuse.

2. Related Art

A 12-volt DC power source voltage is usually used as a DC source voltage in a vehicle. However, a load to be used in a vehicle is not limited to a load to be used at a 12 volts DC. For example, a load to be used at 42 volts DC is provided in a vehicle in Europe. In general, after a DC 42-volt source voltage has been lowered to a DC 12-volt source voltage to be used, the DC 12-volt source voltage is supplied to a load to be used at 12 volts DC. The DC 42-volt source voltage cannot be lowered, in unmodified form, to 12 volts DC. For this reason, there has been employed a DC-DC converter, wherein the DC voltage is converted into an AC voltage, the AC voltage is lowered to a desired voltage, and the thus-lowered AC voltage is converted into a desired DC voltage.

A known DC-DC converter has a circuit configuration such as that shown in FIG. 6. A DC power supply (i.e., a battery) is connected to a power MOSFET 11 and a power MOSFET 13 by way of a fuse 10, and the source of the power MOSFET 11 is connected to the drain of a MOSFET 12. Further, the source of the MOSFET 12 is connected to one end of a resistor R10. The remaining end of the resistor R10 is grounded. The source of the power MOSFET 13 is connected to the drain of a MOSFET 14, and the source of the MOSFET 14 is connected to one end of a resistor R11. The remaining end of the resistor R11 is grounded. The power MOSFET 11 and the power MOSFET 13 constitute a higher-potential side of the DC-DC converter.

A primary coil 21 is connected to points between four terminals, one terminal belonging to each of the power MOSFET 11, the MOSFET 12, the power MOSFET 13, and the MOSFET 14; specifically, the primary coil 21 is connected across a junction G between the power MOSFET 11 and the MOSFET 12 and a junction H between the power MOSFET 13 and the MOSFET 14. A secondary coil 22 is disposed so as to oppose the primary coil 21. The turns ratio between the primary coil 21 and the secondary coil 22 is determined in accordance with a target voltage to which the source voltage is to be lowered. When an electric current flows through the primary coil 21, a lower voltage determined by the turns ratio develops in the secondary coil 22.

A driver circuit 15 is connected to the gate of the power MOSFET 11, and the power MOSFET 11 is controlled so as to become active or inactive in response to a gate signal output from the driver circuit 15. The driver circuit 15 is connected to a charge pump circuit 16. The charge pump circuit 16 is made of; for example, a voltage-multiplication capacitor which is constituted by means of stacking capacitors into a plurality of layers, and boosts a source voltage of 12V supplied from the battery to a higher voltage (for example, 22V) and supplies the thus-boosted voltage to the driver circuit 15.

A driver circuit 17 is connected to the gate of the power MOSFET 13, and the power MOSFET 13 is controlled so as to become active or inactive in accordance with a gate signal output from the driver circuit 17. The driver circuit 17 is connected to a charge pump circuit 18. The charge pump circuit 18 is identical with the charge pump circuit 16 in terms of configuration and function.

A driver circuit 19 is connected to the gate of the MOSFET 12, and the MOSFET 12 is controlled so as to become active and inactive in response to a gate signal output from the driver circuit 19. Further, a driver circuit 20 is connected to the gate of the MOSFET 14, and the MOSFET 14 is controlled so as to become active or inactive in response to a gate signal output from the driver circuit 20.

In the DC-DC converter having the previously-described circuit configuration, in a case where the power MOSFET 11, the MOSFET 12, the power MOSFET 13, and the MOSFET 14 are inactive and where the power MOSFET 11 and the MOSFET 14 are simultaneously turned on in response to the gate signals output from the driver circuits 15 and 20, a DC current flows from the battery VB and through the primary coil 21 in the direction designated by arrow C, by way of the drain and source of the power MOSFET 11. The DC current flows to the ground by way of the drain and source of the MOSFET 14 and the resistor R11. As a result of the power MOSFET 11 and the MOSFET 14 being turned on, a half-wave of an AC current (for example, a positive half-wave) is formed; specifically, a DC current whose voltage corresponds to a boosted voltage determined by the turns ratio (i.e., the remaining side of the half-wave; for example, a negative half-wave) arises in the secondary coil 22.

After the power MOSFET 11 and the MOSFET 14 have been activated for a predetermined period of time, the driver circuit 15 deactivates the power MOSFET 11, and the driver circuit 20 deactivates the MOSFET 14. Simultaneously, the MOSFET 12 and the power MOSFET 13 are turned on in response to the corresponding gate signals output from the driver circuit 17 and the driver circuit 19. When the MOSFET 12 and the power MOSFET 13 are turned on, a DC current flows from the battery VB and through the primary coil 21 in the direction designated by arrow D, by way of the source and drain of the power MOSFET 13 (i.e., in the direction opposite that in which the DC current flows when the power MOSFET 11 and the MOSFET 14 are turned on). The DC current flows to the ground by way of the drain and source of the MOSFET 12 and the resistor R10. As a result of the MOSFET 12 and the power MOSFET 13 being turned on, the DC current, which flows in the direction opposite that in which the DC current flows when the power MOSFET 11 and the MOSFET 14 are turned on, induces in the secondary coil 22 a DC current whose voltage corresponds to a lowered voltage determined by the turns ratio (i.e., the remaining half-wave; for example, a negative half-wave). The DC current is converted into an AC current by means of successive occurrence of two types of induced currents (i.e., two types of half-waves).

After the MOSFET 12 and the power MOSFET 13 have been activated for a predetermined period of time, the power MOSFET 11 and the MOSFET 14 are activated for a predetermined period of time. As mentioned above, the power MOSFETs 11 and 14 and the power MOSFETs 12 and 13 are turned on alternately, and a lowered AC current is output from the secondary coil 22. The AC current arising in the secondary coil 22 in the manner mentioned previously is subjected to half-wave rectification (rectification of a positive half-wave) by a half-wave rectification circuit 23. The thus-rectified current is smoothed by a smoothing circuit 24, thereby producing a DC voltage which has been lowered by a predetermined level.

The resistor R10 is for sensing an electric current. In the event that a short circuit or a like failure arising in the secondary circuit is detected as a result of monitoring a potential difference across the resistor R10, the driver circuit 19 is activated to interrupt the MOSFET 12. Similarly, the resistor R11 is for sensing an electric current. In the event that a short circuit or a like failure arising in the secondary circuit is found as a result of monitoring a potential difference across the resistor R11, the driver circuit 20 is activated to interrupt the MOSFET 14.

In the event that a large current develops as a result of a short circuit or a like failure arising in the primary circuit, the fuse 10 is heated when the large current flows through the primary circuit. If an electric current of a predetermined value or higher flows through the primary circuit, the fuse 10 is melted, thereby interrupting the power supply to the primary circuit so as to protect the primary circuit.

As mentioned above, in the known DC-DC converter, in the event that a large current flows through a circuit for reasons of a short circuit, a fuse is melted, thereby interrupting power supply to the circuit. If a large current flows through a circuit for any reason and the fuse is melted, power supply is not supplied to the circuit until the melted fuse is replaced by a new one. Replacing a fuse involves maintenance.

The known DC-DC converter uses a fuse for protecting a circuit. The rating of the fuse is determined by the current designed to flow through the circuit. The diameter of a wire harness of the fuse must be determined in accordance with the rating of the fuse, thereby posing a difficulty in making the wire harness compact.

The known DC-DC converter uses a fuse for protecting a circuit, and the fuse is melted when a large current flows through the fuse. Even when a large current temporarily flows through a circuit, which would be caused by an incomplete short circuit (which would also be hereinafter referred to as a "rare short circuit") and not by a complete short circuit (which would also be hereinafter referred to as a "dead short circuit") and would not require interrupting power supply to a circuit, the fuse is melted, thus making detection of an anomalous short circuit impossible.

Since the known DC-DC converter utilizes melting action of a fuse for protecting a circuit, there is a necessity for using, as a wire of a circuit constituting a DC-DC converter, a wire harness whose diameter is sufficient to withstand the current which flows through a circuit in the event of occurrence of a dead short circuit, thus posing a difficulty in rendering the wire harness compact.

SUMMARY OF INVENTION

The present invention is aimed at eliminating a necessity for maintenance for reactivating a DC-DC converter even when circuit protection is effected at the time of flow of a large current due to a short circuit or a like failure, reducing the diameter of a wire harness and making the wire harness compact, and readily detecting occurrence of a rare short circuit.

Accordingly, the present invention provides a fuseless DC-DC converter which includes a plurality of parallel-connected FETs, is repeatedly turned on and off by alternate activation/deactivation of higher-level FETs and activation/deactivation of lower-level FETs, to thereby induce an AC current from a DC current in midpoints between the higher-level FETs and the lower-level FETs, boosts or lowers the AC current to a predetermined voltage, and converts the AC current into a DC current, to thereby produce a DC power supply whose voltage is boosted or lowered with reference to a source voltage, wherein one of the parallel-connected FETs is embodied by a power supply controller, the power supply controller comprising:

a load circuit formed by placing a first overheat self-interruption-type semiconductor switch in series between a DC power supply and a load;

a second overheat-self-interruption-type semiconductor switch connected in parallel with the first overheat-self-interruption-type semiconductor switch;

a reference circuit whose one end is connected to the source of the second overheat-self-interruption-type semiconductor switch and whose other end is grounded and which induces, across the drain and source of the second overheat-self-interruption-type semiconductor switch, the same voltage as that arising across the drain and source of the first overheat-self-interruption-type semiconductor switch when a constant load current flows through the first overheat-self-interruption-type semiconductor switch; and a comparator circuit which compares the source voltage of the first overheat-self-interruption-type semiconductor switch with a reference voltage applied to the source of the second overheat-self-interruption-type semiconductor switch, and the power supply controller deactivating the first overheat-self-interruption-type semiconductor switch when, on the basis of the result of the comparison performed by the comparator circuit, a current of a predetermined value or greater is determined to have flowed through the first overheat-self-interruption-type semiconductor switch; controlling activation or deactivation of the first overheat-self-interruption-type semiconductor switch under predetermined conditions and at a predetermined duty cycle; determining that an anomaly, such as a short circuit, has arisen in the load circuit, when the activation and deactivation of the first overheat-self-interruption-type semiconductor switch has continued for a predetermined period of time; and interrupting the first overheat-self-interruption-type semiconductor switch, to thereby suspend power supply to the load.

By means of the above-described configuration of the present invention, a circuit can be protected from a large current, which would otherwise be caused by a short circuit or a like failure, without use of a fuse. Even if a circuit is protected from a large current at the time of a short circuit, reactivation of the circuit does not involve maintenance. The diameter of a wire harness is reduced, thus saving the weight of the wire hardness.

Preferably, the predetermined conditions under which the first overheat-self-interruption-type semiconductor switch is controlled to be activated or deactivated at a predetermined duty cycle are such that the first overheat-self-interruption-type semiconductor switch is deactivated when the voltage across the drain and source of the first overheat-self-interruption-type semiconductor switch has become smaller than a threshold voltage set to 60% to 80% the source voltage and when the source voltage of the first overheat-self-interruption-type semiconductor switch has become higher than the source voltage of the second overheat-self-interruption-type semiconductor switch; and such that the first overheat-self-interruption-type semiconductor switch is deactivated when the voltage across the drain and source of the first overheat-self-interruption-type semiconductor switch has become higher than a threshold voltage set to 60% to 80% the source voltage.

By means of the foregoing configuration of the present invention, a circuit can be protected from a large current, which would otherwise be caused by a short circuit or a like failure, without use of a fuse. Even if a circuit is protected from a large current at the time of a short circuit, reactivation of the circuit does not involve maintenance. The diameter of a wire harness is reduced, thus saving the weight of the wire hardness. Further, the present invention enables not detection of complete short circuit (i.e., a dead short) but facilitated detection of an incomplete short circuit (i.e., a rare short).

Preferably, the power supply controller is additionally provided with a forceful driver circuit which forcefully activates the first overheat-self-interruption-type semiconductor switch, by application, to the comparator circuit, of a partial voltage which is obtained by division of the source voltage, when a potential difference across the drain and source of the first overheat-self-interruption-type semiconductor switch is increased by an internal resistor of the first overheat-self-interruption-type semiconductor switch, after the first overheat-self-interruption-type semiconductor switch has been deactivated on the basis of an output which is issued by the comparator circuit upon detection of an overcurrent due to an anomaly, such as a short circuit in the load circuit.

By means of the foregoing configuration of the present invention, a circuit can be protected from a large current, which would otherwise be caused by a short circuit or a like failure, without use of a fuse. Even if a circuit is protected from a large current at the time of a short circuit, reactivation of the circuit does not involve maintenance. The diameter of a wire harness is reduced, thus saving the weight of the wire hardness. Further, the present invention enables determination as to whether or not the flow of a large current is ascribable to a complete short circuit (i.e., a dead short) or another, temporary reason.

DETAILED DESCRIPTION OF PREFERRED EMBODIMENTS

Preferred embodiments of the invention will be described hereinbelow.

Figure 1:
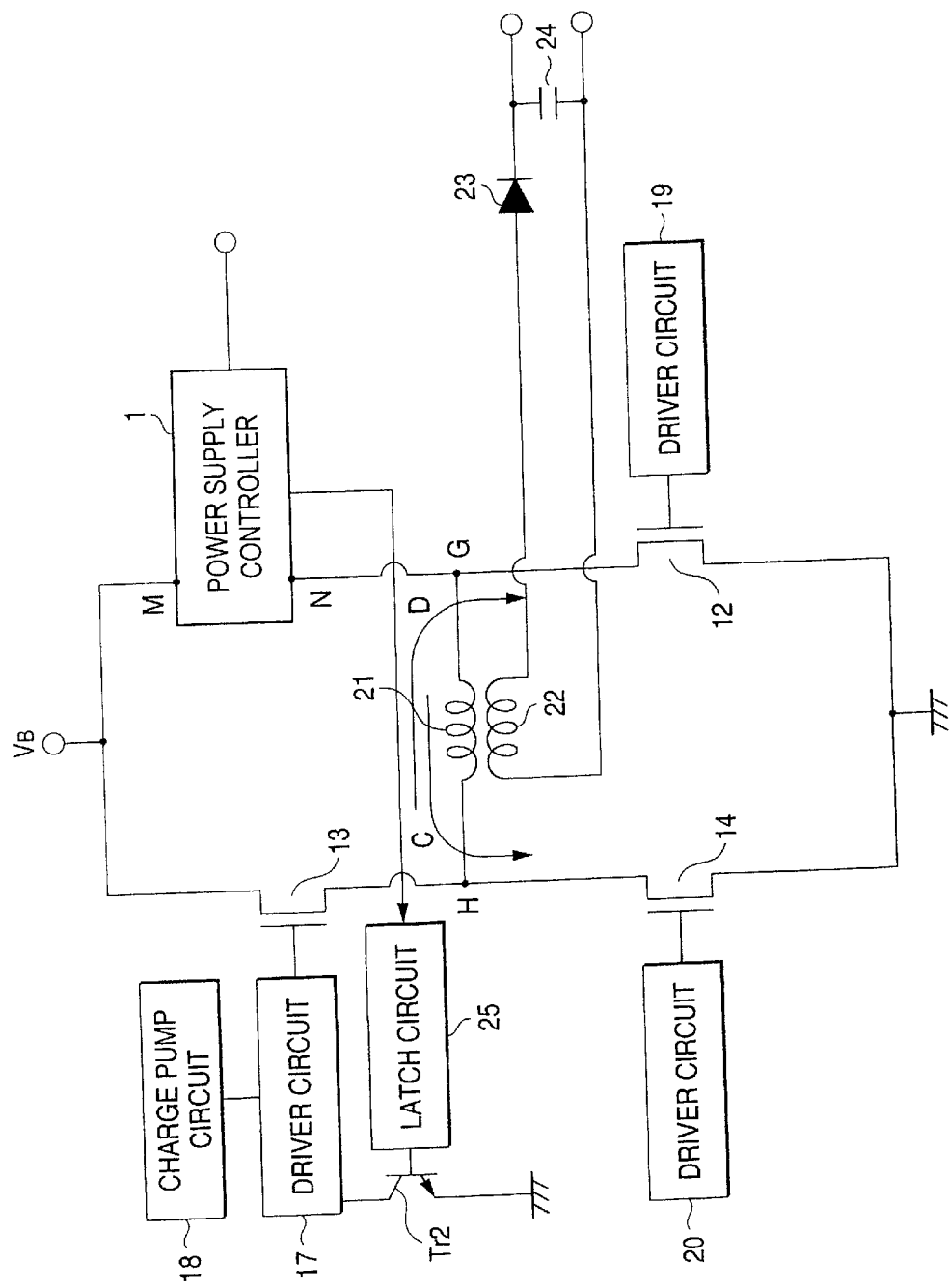
FIG. 1 is a circuit diagram showing the entirety of a fuseless DC-DC converter of the present invention.

FIG. 1 shows a fuseless DC-DC converter according to a first embodiment of the present invention.

In the drawing, a DC power source (i.e., a battery) VB is connected to an input terminal M of a power supply controller 1, and an output terminal N of the power supply controller 1 is connected to the drain of a MOSFET 12. The source of the MOSFET 12 is grounded, and the drain of the same is connected to the DC power source VB. The source of a power MOSFET 13 is connected to the drain of a MOSFET 14, and the source of the MOSFET 14 is grounded. The power supply controller 1 and the power MOSFET 13 constitute a higher-potential side of the fuseless DC-DC converter.

A primary coil 21 is connected to points between four terminals, one terminal belonging to each of the power supply controller 1, the MOSFET 12, the power MOSFET 13, and the MOSFET 14; specifically, the primary coil 21 is connected across a junction G between the power supply controller 1 and the MOSFET 12 and a junction H between the power MOSFET 13 and the MOSFET 14. A secondary coil 22 is disposed so as to oppose the primary coil 21. The turns ratio between the primary coil 21 and the secondary coil 22 is determined in accordance with a target voltage to which the source voltage is to be lowered. When an electric current flows through the primary coil 21, a lower voltage determined by the turns ratio develops in the secondary coil 22.

A driver circuit 17 is connected to the gate of the power MOSFET 13, and the power MOSFET 13 is controlled so as to become active or inactive in response to a gate signal output from the driver circuit 17. The driver circuit 17 is connected to a charge pump circuit 18. The charge pump circuit 18 is made of, for example, a voltage-multiplication capacitor which is constituted by means of stacking capacitors into a plurality of layers, and boosts a source voltage of 12V supplied from the battery to a higher voltage (for example, 22V) and supplies the thus-boosted voltage to the driver circuit 17.

Further, the driver circuit 17 is connected to an emitter-grounded NPN transistor Tr2. The base of the NPN transistor Tr2 is connected to a latch circuit 25 (constituted of; for example, a D-type flip-flop). The latch circuit 25 receives an overcurrent detection signal which would be output when the power supply controller 1 detects overcurrent. Upon receipt of the overcurrent detection signal, the latch circuit 25 retains an overcurrent-detected state until the latch circuit 25 is reset. When the power supply controller 1 detects overcurrent, the latch circuit 25 turns on the NPN transistor Tr2, thereby activating or deactivating the driver circuit 17. When the power supply controller 1 detects overcurrent, the power MOSFET 13 is interrupted, thereby completely interrupting the circuit for producing a half-wave of an AC current.

A driver circuit 19 is connected to the gate of the MOSFET 12, and the MOSFET 12 is controlled to as to become active or inactive in response to a gate signal output from the driver circuit 19. The gate of the MOSFET 14 is connected to a driver circuit 20. The MOSFET 14 is controlled so as to become active or inactive in response to a gate signal output from the driver circuit 20.

Figure 2:
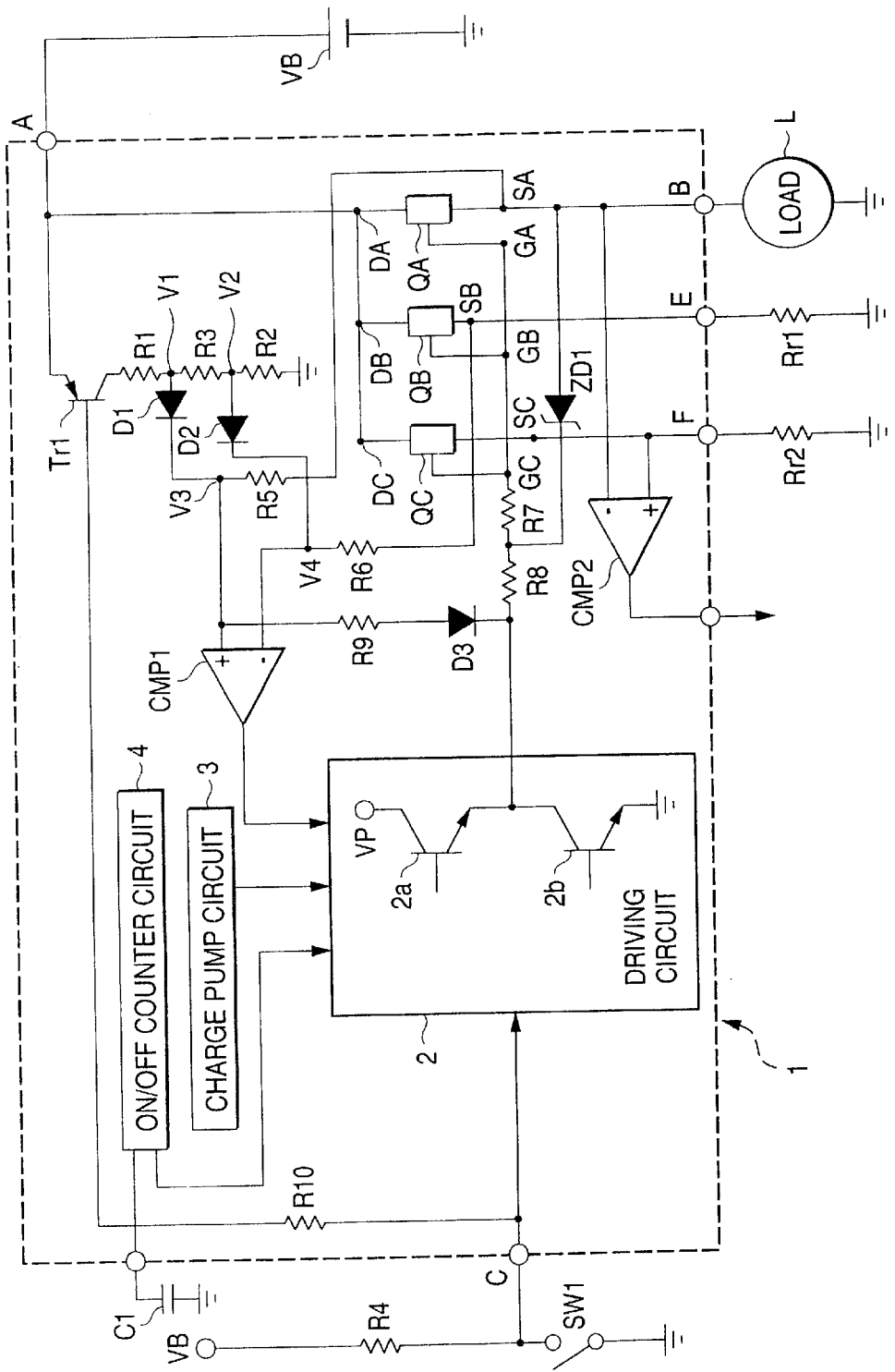
FIG. 2 is a detailed circuit diagram showing a power supply controller shown in FIG. 1.

The power supply controller 1 has a circuit configuration such as that shown in FIG. 2.

As shown in the drawing, the power supply controller 1 is formed into a single semiconductor chip which controls an electric current supplied to a load. Circles provided in the power supply controller 1 denote connection terminals to which external elements are connected.

More specifically, an input terminal A of the power supply controller 1 is connected to the battery VB, and an output terminal B is connected to the primary coil 21 which is shown in FIG. 1 and is designated by the load L. A switching terminal C is connected to a switch SW1 whose one end is grounded and whose remaining end is connected to the battery VB by way of a resistor R4.

The input terminal A is connected to a drain DA of a first overheat-self-interruption-type semiconductor switch QA, and the output terminal B is connected to a source terminal SA of the first overheat-self-interruption-type semiconductor switch QA. The first overheat-self-interruption-type semiconductor switch QA is also provided with a gate terminal GA. The first overheat-self-interruption-type semiconductor switch QA is provided in series between the battery VB and the load L (i.e., the primary coil 21).

Figure 3:
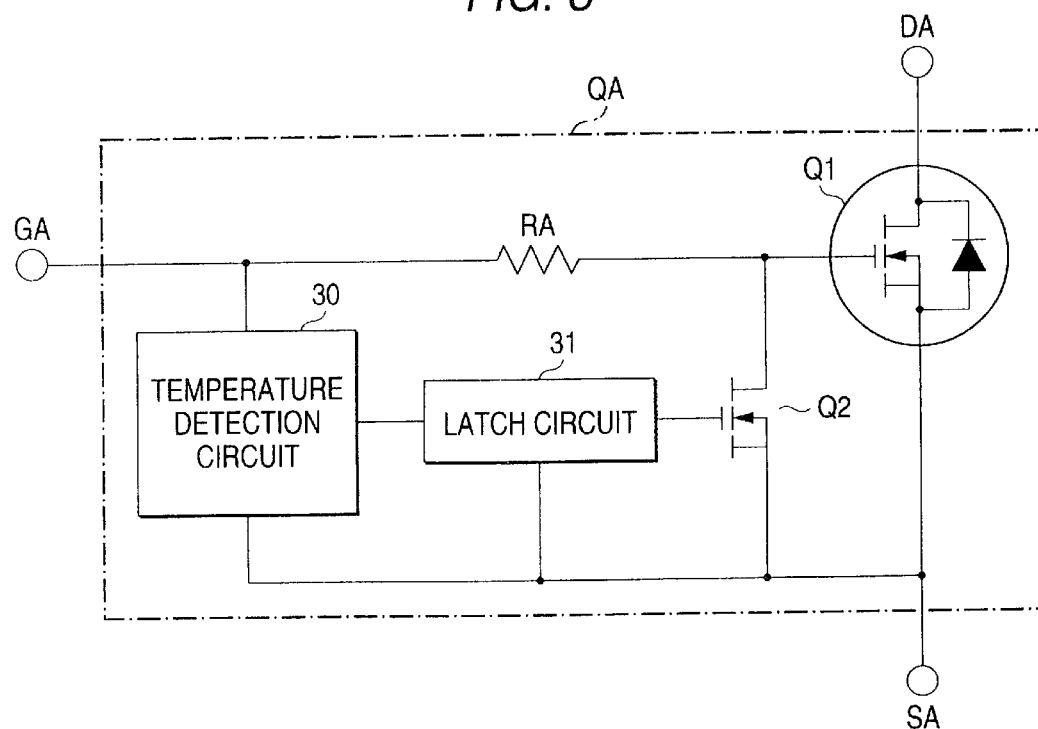
FIG. 3 is a detailed circuit diagram showing a first overheat-self-interruption-type semiconductor switch QA shown in FIG. 2.

The first overheat-self-interruption-type semiconductor switch QA has a circuit configuration such as that shown in FIG. 3. The drain terminal DA of the first overheat-self-interruption-type semiconductor switch QA is connected to the drain of a primary FET Q1, and the source of the primary FET Q1 is connected to the source terminal SA. The gate of the primary FET Q1 is connected to the gate terminal GA by way of an internal resistor RA (of, for example, 10 kΩ). A temperature detection circuit 30 is placed between the gate terminal GA and the source terminal SA. The temperature detection circuit 30 is for detecting the temperature of the primary FET Q1 and is connected to a latch circuit 31. When the primary FET Q1 has achieved a predetermined temperature (i.e., an anomalous temperature), the temperature detection circuit 30 outputs an ON signal to the latch circuit 31. Upon receipt of the ON signal output from the temperature detection circuit 30, the latch circuit 31 outputs the ON signal in turn. An output terminal of the latch circuit 31 is connected to the gate of an overheat interruption FET Q2. In response to the ON signal which is output from the temperature detection circuit 30 by way of the latch circuit 31 when overheat of the primary FET Q1 is detected by the temperature detection circuit 30, the overheat interruption FET Q2 is turned on, thereby dropping the voltage applied to the gate of the primary FET Q1 so as to interrupt the primary FET Q1.

The source terminal SA of the first overheat-self-interruption-type semiconductor switch QA is connected to the load L (i.e., the primary coil 21) by way of the output terminal B. The primary FET Q1 of the first overheat-self-interruption-type semiconductor switch QA supplies power to the load L (i.e., the primary coil 21).

As mentioned above, the first overheat-self-interruption-type semiconductor switch QA has an overheat self-interruption function of forcefully deactivating (interrupting) the primary FET Q1 so as to prevent destruction of the primary FET Q1, which would otherwise be caused by overheat, in the event that the primary FET Q1 has achieved a predetermined temperature or more as a result of the flow of overcurrent stemming from a short circuit or a like failure. The primary FET Q1 constituting the first overheat-self-interruption-type semiconductor switch QA is formed from an NMOSFET of DMOS structure.

The drain terminal DA of the first overheat-self-interruption-type semiconductor switch QA is connected to a drain terminal DB of a second overheat-self-interruption-type semiconductor switch QB and a drain terminal DC of a third overheat-self-interruption-type semiconductor switch QC. A source terminal SB of the second overheat-self-interruption-type semiconductor switch QB is connected to an output terminal E, and a source terminal SC of the third overheat-self-interruption-type semiconductor switch QC is connected to an output terminal F. The second overheat-self-interruption-type semiconductor switch QB is provided with a gate terminal GB, and the third overheat-self-interruption-type semiconductor switch QC is provided with a gate terminal GC.

Figure 4:
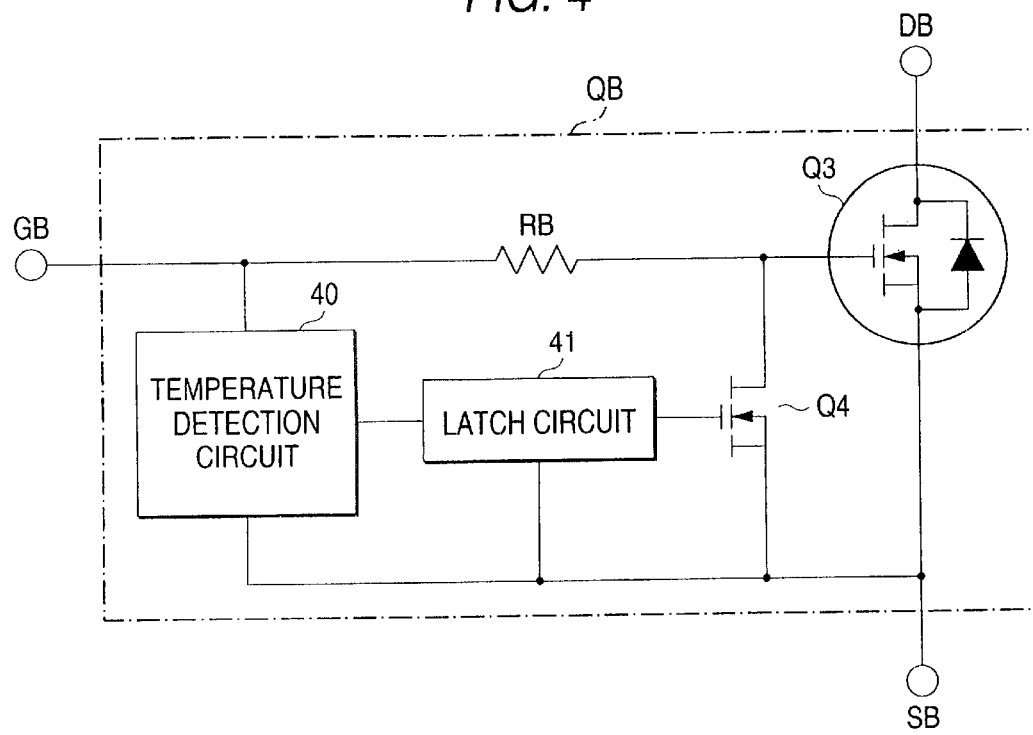
FIG. 4 is a detailed circuit diagram showing a second overheat-self-interruption-type semiconductor switch QB shown in FIG. 2.

The second overheat-self-interruption-type semiconductor switch QB has a circuit configuration such as that shown in FIG. 4. The second overheat-self-interruption-type semiconductor switch QB is identical in configuration with the first overheat-self-interruption-type semiconductor switch QA illustrated in FIG. 3. The drain terminal DB of the second overheat-self-interruption-type semiconductor switch QB is connected to the drain of a primary FET Q3, and the source of the primary FET Q3 is connected to the source terminal SB. The gate of the primary FET Q3 is connected to the gate terminal GB by way of an internal resistor RB (of, for example, 10 kΩ). A temperature detection circuit 40 is placed between the gate terminal GB and the source terminal SB. The temperature detection circuit 40 is for detecting the temperature of the primary FET Q3 and is connected to a latch circuit 41. In the event that the primary FET Q3 has achieved a predetermined temperature or more (i.e., an anomalous temperature) as a result of a current greater than a predetermined value flowing through the primary FET Q3, the temperature detection circuit 40 outputs an ON signal to the latch circuit 41. Upon receipt of the ON signal output from the temperature detection circuit 40, the latch circuit 41 outputs the ON signal in turn. An output terminal of the latch circuit 41 is connected to the gate of an overheat interruption FET Q4. When overheat of the primary FET Q3 is detected by the temperature detection circuit 40, the overheat interruption FET Q4 is turned on in response to the ON signal output from the temperature detection circuit 40 by way of the latch circuit 41, thereby dropping the voltage applied to the gate of the primary FET Q3 so as to interrupt the primary FET Q3.

The source terminal SB of the second overheat-self-interruption-type semiconductor switch QB is connected to a first reference resistor Rr1 by way of the output terminal E. The remaining terminal of the first reference resistor Rr1 is grounded. The primary FET Q3 and the first reference resistor Rr1 constitute a first reference circuit. The first reference circuit is placed in parallel between the load L and the primary FET Q1 of the first overheat-self-interruption-type semiconductor switch QA.

The first reference circuit turns on the primary FET Q1 of the first overheat-self-interruption-type semiconductor switch QA, thereby allowing flow of an electric current to the load L (i.e., the primary coil 21). The first reference circuit causes a constant voltage (i.e., a reference voltage) to arise in the source (i.e., the source terminal SB) of the primary FET Q3 of the second overheat-self-interruption-type semiconductor switch QB, the reference voltage being (i.e., a reference voltage) identical with the voltage which arises in the source (i.e., the source terminal SA) of the primary FET Q1 of the first overheat-self-interruption-type semiconductor switch QA in a state in which an electric current normally flows through the load L (the primary coil 21). A constant source voltage always arises in the source (i.e., the source terminal SB) of the primary FET Q3 of the second overheat-self-interruption-type semiconductor switch QB, without regard to a change in the state of the load L (i.e., the primary coil 21) connected to the source terminal SA of the first overheat-self-interruption-type semiconductor switch QA. The source voltage of the primary FET Q3 of the second overheat-self-interruption-type semiconductor switch QB corresponds to a first reference voltage. In the event that overcurrent has flowed through the primary FET Q1 of the first overheat-self-interruption-type semiconductor switch QA, the first reference voltage is compared with the source voltage developing in the source (i.e., the source terminal SA) of the primary FET Q1, thereby detecting flow of overcurrent through the load L (i.e., the primary coil 21).

The second overheat-self-interruption-type semiconductor switch QB has an overheat self-interruption function of forcefully deactivating (interrupting) the primary FET Q3 so as to prevent destruction of the primary FET Q3, which would otherwise be caused by overheat, in the event that overcurrent flows through the primary FET Q3 of the second overheat-self-interruption-type semiconductor switch QB for reasons of a short circuit in the first reference resistor Rr1 connected to the source of the primary FET Q3. The primary FET Q3 constituting the second overheat-self-interruption-type semiconductor switch QB is formed from an NMOS-FET of DMOS structure.

Figure 5:
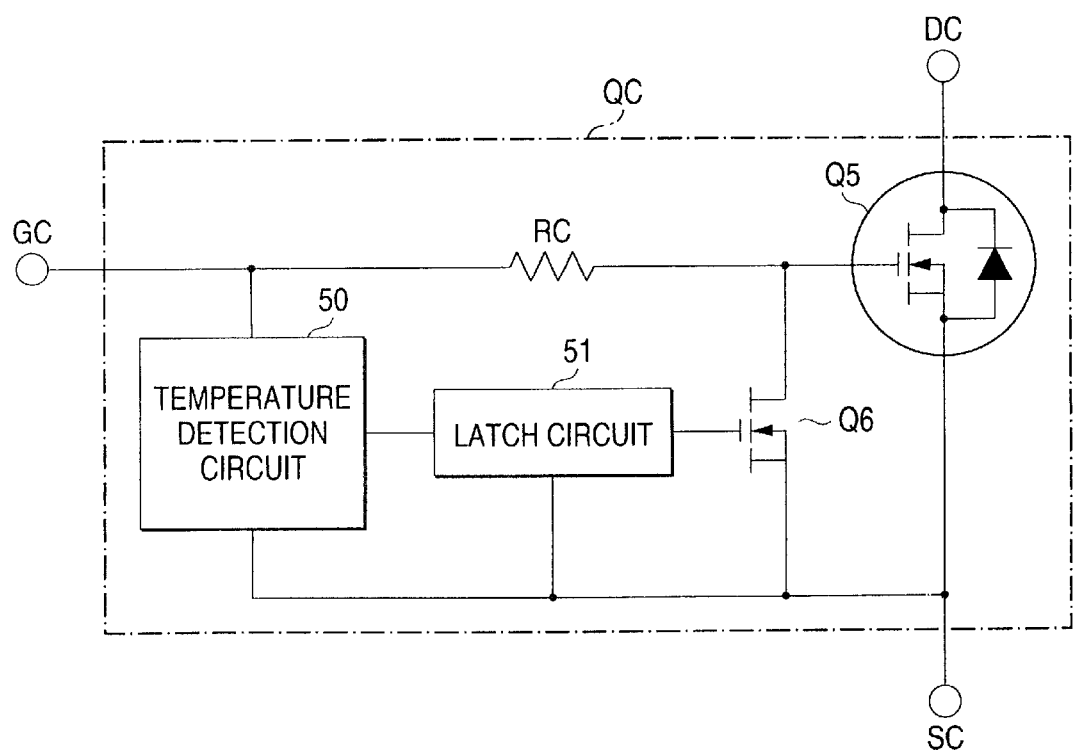
FIG. 5 is a detailed circuit diagram showing a third overheat-self-interruption-type semiconductor switch QC shown in FIG. 2.
Figure 6:
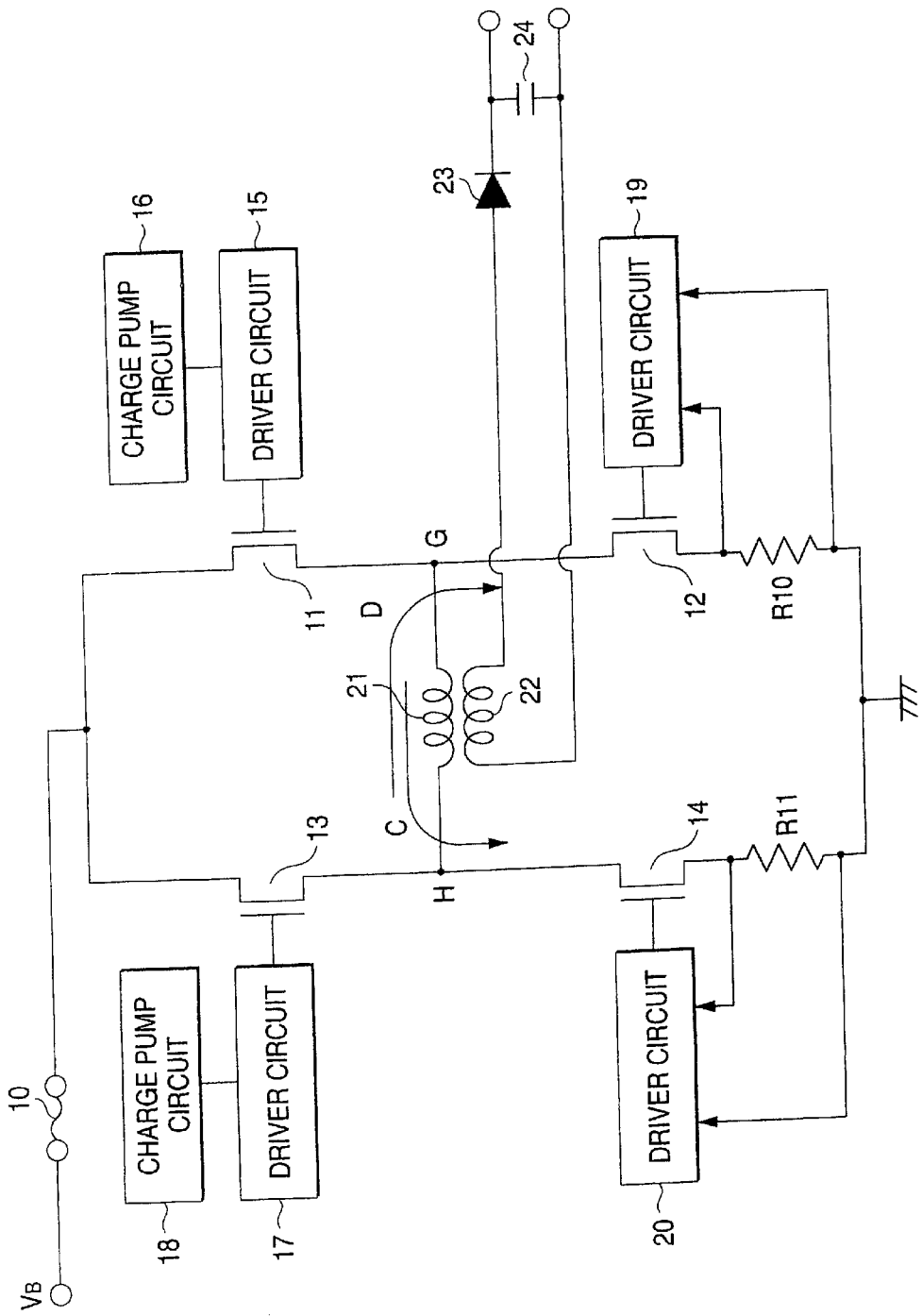
FIG. 6 is a circuit diagram showing the entirety of a known DC-DC converter.

The third overheat-self-interruption-type semiconductor switch QC has a circuit configuration such as that shown in FIG. 5. The third overheat-self-interruption-type semiconductor switch QC is identical in configuration with the first overheat-self-interruption-type semiconductor switch QA illustrated in FIG. 3. The drain terminal DC of the third overheat-self-interruption-type semiconductor switch QC is connected to the drain of a primary FET Q5, and the source of the primary FET Q5 is connected to the source terminal SC. The gate of the primary FET Q5 is connected to the gate terminal GC by way of an internal resistor RC (of, for example, 10 kΩ). A temperature detection circuit 50 is placed between the gate terminal GC and the source terminal SC. The temperature detection circuit 50 is for detecting the temperature of the primary FET Q5 and is connected to a latch circuit 51. In the event that the primary FET Q5 has achieved a predetermined temperature or more (i.e., an anomalous temperature) as a result of a current greater than a predetermined value flowing through the primary FET Q5, the temperature detection circuit 50 outputs an ON signal to the latch circuit 51. Upon receipt of the ON signal output from the temperature detection circuit 50, the latch circuit 51 outputs the ON signal in turn. An output terminal of the latch circuit 51 is connected to the gate of an overheat interruption FET Q6. When overheat of the primary FET Q5 is detected by the temperature detection circuit 50, the overheat interruption FET Q6 is turned on in response to the ON signal output from the temperature detection circuit 50 by way of the latch circuit 51, thereby dropping the voltage applied to the gate of the primary FET Q5 so as to interrupt the primary FET Q5.

The source terminal SC of the third overheat-self-interruption-type semiconductor switch QC is connected to a second reference resistor Rr2 by way of the output terminal F. The remaining terminal of the first reference resistor Rr2 is grounded. The primary FET Q5 and the second reference resistor Rr2 constitute a second reference circuit. The second reference circuit is placed in parallel between the load L (the primary coil 21) and the primary FET Q1 of the first overheat-self-interruption-type semiconductor switch QA.

The second reference circuit turns on the primary FET Q1 of the first overheat-self-interruption-type semiconductor switch QA, thereby allowing flow of an electric current to the load L (i.e., the primary coil 21). The second reference circuit causes a constant voltage (i.e., a reference voltage) to arise in the source (i.e., the source terminal SC) of the primary FET Q5 of the third overheat-self-interruption-type semiconductor switch QC, the reference voltage being identical with the voltage which arises in the source (i.e., the source terminal SA) of the primary FET Q1 of the first overheat-self-interruption-type semiconductor switch QA in a state in which an electric current normally flows through the load L (the primary coil 21). A constant source voltage always arises in the source (i.e., the source terminal SC) of the primary FET Q5 of the third overheat-self-interruption-type semiconductor switch QC, without regard to a change in the state of the load L (i.e., the primary coil 21) connected to the source terminal SA of the first overheat-self-interruption-type semiconductor switch QA.

The source voltage of the primary FET Q5 of the third overheat-self-interruption-type semiconductor switch QC corresponds to a second reference voltage. In the event that no current (in the even of a break in a load) or undercurrent flows through the load L (i.e., the primary coil 21) without regard to the primary FET Q1 of the first overheat-self-interruption-type semiconductor switch QA being turned on and the current flowing through the primary FET Q1 of the first overheat-self-interruption-type semiconductor switch QA being smaller than a second predetermined value, the source voltage of the primary FET Q1 is compared with the second reference voltage, thus detecting flow of undercurrent through the load L (i.e., the primary coil 21).

The third overheat-self-interruption-type semiconductor switch QC has an overheat self-interruption function of forcefully deactivating (interrupting) the primary FET Q5 so as to prevent destruction of the primary FET Q5, which would otherwise be caused by overheat, in the even that overcurrent flows through the primary FET Q5 of the second overheat-self-interruption-type semiconductor switch QC for reasons of a short circuit in the second reference resistor Rr2 connected to the source of the primary FET Q5. The primary FET Q5 constituting the third overheat-self-interruption-type semiconductor switch QC is formed from an NMOSFET of DMOS structure.

Each of the primary FET Q1 of the first overheat-self-interruption-type semiconductor switch QA, the primary FET Q3 of the second overheat-self-interruption-type semiconductor switch QB, and the primary FET Q5 of the third overheat-self-interruption-type semiconductor switch QC is formed from a plurality of transistors. In terms of the number of transistors constituting the primary FET, the relationship among the primary FETs Q1, Q3, and Q5 is such that Primary FET Q1>Primary FET Q3

Primary FET Q1>Primary FET Q5

More specifically, the number of transistors constituting the primary FET Q1 of the first overheat-self-interruption-type semiconductor switch QA and the number of transistors constituting the primary FET Q3 of the second overheat-self-interruption-type semiconductor switch QB are set to a proportion of 1000:1. Similarly, the number of transistors constituting the primary FET Q1 of the first overheat-self-interruption-type semiconductor switch QA and the number of transistors constituting the primary FET Q5 of the third overheat-self-interruption-type semiconductor switch QC are set to a proportion of 1000:1.

The first reference resistance Rr1 is set to a value which satisfies the following; for example, when a load current (i.e., a drain current) of 5A flows through the primary FET Q1 of the first overheat-self-interruption-type semiconductor switch QA, a drain current of 5 mA flows through the primary FET Q3 of the second overheat-self-interruption-type semiconductor switch QB. Simultaneously, a voltage equal to a voltage Vds across the drain and source of the primary FET Q1 of the first overheat-self-interruption-type semiconductor switch QA arises across the drain and source of the primary FET Q3 of the second overheat-self-interruption-type semiconductor switch QB.

Further, the first reference resistance Rr1 and the second reference resistance Rr2 are set to values which satisfy the following; for example, when a load current (i.e., a drain current) of 5A flows through the primary FET Q1 of the first overheat-self-interruption-type semiconductor switch QA, a drain current of 5 mA flows through the primary FET Q5 of the third overheat-self-interruption-type semiconductor switch QC. Simultaneously, a voltage equal to a voltage Vds across the drain and source of the primary FET Q1 of the first overheat-self-interruption-type semiconductor switch QA arises across the drain and source of the primary FET Q5 of the third overheat-self-interruption-type semiconductor switch QC.

Consequently, so long as the load L (i.e., the primary coil 21) connected to the primary FET Q1 of the first overheat-self-interruption-type semiconductor switch QA is normal, a voltage across the gate and source of the primary FET Q1 of the first overheat-self-interruption-type semiconductor switch QA matches a voltage across the gate and source of the primary FET Q3 of the second overheat-self-interruption-type semiconductor switch QB. Similarly, so long as the load L (i.e., the primary coil 21) connected to the primary FET Q1 of the first overheat-self-interruption-type semiconductor switch QA is normal, a voltage across the gate and source of the primary FET Q1 of the first overheat-self-interruption-type semiconductor switch QA matches a voltage across the gate and source of the primary FET Q5 of the third overheat-self-interruption-type semiconductor switch QC.

The gate of the primary FET Q1 of the first overheat-self-interruption-type semiconductor switch QA, the gate of the primary FET Q3 of the second overheat-self-interruption-type semiconductor switch QB, and the gate of the primary FET Q5 of the third overheat-self-interruption-type semiconductor switch QC are connected to the driver circuit 2 by way of resistors R7 and R8. The primary FET Q1 of the first overheat-self-interruption-type semiconductor switch QA, the primary FET Q3 of the second overheat-self-interruption-type semiconductor switch QB, and the primary FET Q5 of the third overheat-self-interruption-type semiconductor switch QC are simultaneously activated or deactivated in response to a gate signal output from the driver circuit 2.

The source of the primary FET Q1 of the first overheat-self-interruption-type semiconductor switch QA is connected to the anode of a Zener diode ZD1, and the cathode of the Zener diode ZD1 is connected to a node between the resistors R7 and R8. The source of the primary FET Q1 of the first overheat-self-interruption type semiconductor switch QA is also connected to a positive input terminal of a comparator CMP1 and to a negative input terminal of a comparator CMP2, by way of the resistor R5.

The comparator CMP1 compares a voltage developing in the source of the primary FET Q1 of the first overheat-self-interruption-type semiconductor switch QA with a voltage developing in the source of the primary FET Q3 of the second overheat-self-interruption-type semiconductor switch QB, to thereby detect flow of overcurrent through the load L (i.e., the primary coil 21) connected to the primary FET Q1 of the first overheat-self-interruption-type semiconductor switch QA. More specifically, the source voltage (i.e., the potential of the source SA terminal) of the primary FET Q1 of the first overheat-self-interruption-type semiconductor switch QA is compared with the source voltage (i.e., the potential of the source SB terminal) of the primary FET Q3 of the second overheat-self-interruption-type semiconductor switch QB. While the difference between the source voltages remains smaller than an overcurrent determination value (i.e., while the source voltage of the primary FET Q1 of the first overheat-self-interruption-type semiconductor switch QA is higher than the source voltage of the primary FET Q3 of the second overheat-self-interruption-type semiconductor switch QB), the comparator CMP1 outputs a HIGH-level signal. If the difference becomes higher than the overcurrent determination value (i.e., when the source voltage of the primary FET Q1 of the first overheat-self-interruption-type semiconductor switch QA becomes smaller than the source voltage of the primary FET Q3 of the second overheat-self-interruption-type semiconductor switch QB), the comparator CMP1 outputs a reverse signal (i.e., a LOW-level signal), thus determining flow of overcurrent.

The comparator CMP2 compares a voltage developing in the source of the primary FET Q1 of the first overheat-self-interruption-type semiconductor switch QA with a voltage developing in the source of the primary FET Q5 of the third overheat-self-interruption-type semiconductor switch QC, to thereby determine whether or not a predetermined amount of electric current flows through the primary FET Q1 of the first overheat-self-interruption-type semiconductor switch QA. More specifically, the source voltage (i.e., the potential of the source SA terminal) of the primary FET Q1 of the first overheat-self-interruption-type semiconductor switch QA is compared with the source voltage (i.e., the potential of the source SC terminal) of the primary FET Q5 of the third overheat-self-interruption-type semiconductor switch QC. While the difference between the source voltages remains smaller than an undercurrent determination value (i.e., while the source voltage of the primary FET Q1 of the first overheat-self-interruption-type semiconductor switch QA is smaller than the source voltage of the primary FET Q5 of the third overheat-self-interruption-type semiconductor switch QC), the comparator CMP2 outputs a HIGH-level signal. If the difference becomes higher than the undercurrent determination value (i.e., when the source voltage of the primary FET Q1 of the first overheat-self-interruption-type semiconductor switch QA becomes higher than the source voltage of the primary FET Q5 of the third overheat-self-interruption-type semiconductor switch QC), the comparator CMP2 outputs a reverse signal (i.e., a LOW-level signal), thus determining flow of undercurrent.

The source of the primary FET Q3 of the second overheat-self-interruption-type semiconductor switch QB is connected to a negative input terminal of the comparator CMP1 by way of a resistor R6.

Further, the source of the primary FET Q5 of the third overheat-self-interruption-type semiconductor switch QC is connected to a positive input terminal of the comparator CMP 2.

The input terminal A of the power supply controller 1 is connected to the emitter of a PNP transistor Tr1, and the collector of the PNP transistor Tr1 is connected to a series circuit comprising resistors R1, R3, and R2. The remaining terminal of the resistor R2 is grounded. The positive input terminal of the comparator CMP 1 is connected to a node between the resistors R1 and R3, by way of a diode D1. The negative input terminal of the comparator CMP 1 is connected to a node between the resistors R2 and R3, by way of a diode D2. Consequently, a voltage, which is obtained as a result of division of the source voltage supplied from the battery VB at a ratio of voltage division between the resistance of the resistor R1 and the combined resistance of the resistors R2 and R3, is applied to the positive input terminal of the comparator CMP 1. Further, a voltage, which is obtained as a result of division of the source voltage supplied from the battery VB at a ratio of voltage division between the resistance of the resistor R2 and the combined resistance of the resistors R1 and R3, is applied to the negative input terminal of the comparator CMP 1.

The PNP transistor Tr1, the resistors R1, R2, and R3, and the diodes D1 and D2 constitute a reset circuit which resets the primary FET Q1 of the first overheat-self-interruption-type semiconductor switch QA to an ON state after the primary FET Q1 of the first overheat-self-interruption-type semiconductor switch QA has been turned off for reasons of an anomaly, such as a short circuit. More specifically, the reset circuit comprises the PNP transistor Tr1 whose emitter is connected to the input terminal A connected to the battery VB and whose base is connected by way of the resistor R10 to the input terminal C connected to the switch SW1; the resistors R1, R2, and R3 connected in series between the collector of the PNP transistor Tr1 and ground; the diode D1 which permits flow of the current flowing through the resistor R1 to the positive input terminal of the comparator CMP 1; and the diode D2 which permits flow of the current flowing through the resistors R1 and R3 to the negative input terminal of the comparator CMP 1. The resistance of the resistor R1 is set such that potential V1 of the node between the resistors R1 and R3 corresponds to about 60% to 80% the voltage of the battery VB when the PNP transistor Tr1 is turned on by actuation of the switch SW1 and such that the potential of the source terminal SA becomes higher than a voltage V3 (the potential of the case of the diode D1) which is lowered by only a drop in potential caused by the resistor R5.

The anode of the diode D3 is connected to the positive input terminal of the comparator CMP1 by way of a resistor R9, and a gate signal output terminal of the driver circuit 2 is connected to the cathode of the diode D3.

The output terminal of the comparator CMP 1 is connected to the driver circuit 2, and the result of determination made by the comparator CMP1 is input to the driver circuit 2. A voltage VP (for example, VP=VB+5V), which is boosted by the charge pump circuit 3, is applied to the driver circuit 2. When the driver circuit 2 receives a HIGH signal output from the comparator CMP1 and an ON signal output from the switch SW1 as a result of actuation of the switch SW1, the a source-side transistor 2a of the driver circuit 2 is turned on, whereas a drain-side transistor 2b of the driver circuit 2 is turned off. As a result, a drive signal of voltage VP is output to the gate of the primary FET Q1 of the first overheat-self-interruption-type semiconductor switch QA by way of the resistors R7 and R8, thereby activating the FET Q1 of the first overheat-self-interruption-type semiconductor switch QA. While the HIGH signal is input to the driver circuit 2 from the comparator CMP 1 (unless a LOW signal is output), the driver circuit 2 continues to output the ON signal to the gate of the primary FET Q1 of the first overheat-self-interruption-type semiconductor switch QA. When the comparator CMP 1 reverses an output and outputs a LOW signal, the source-side transistor 2a of the driver circuit 2 is turned off, thereby activating the drain-side transistor 2b. When the LOW signal is output from the driver circuit 2, an OFF signal is output to the gate of the primary FET Q1 of the first overheat-self-interruption-type semiconductor switch QA, thereby deactivating the primary FET Q1 of the first overheat-self-interruption-type semiconductor switch QA.

The output terminal of the comparator CMP 2 is connected to an output terminal G to which an external device is to be connected. The result of the determination performed by the comparator CMP 2 is used by a circuit connected to the output terminal G.

When the switch SW1 is turned on at start-up, the PNP transistor Tr1 is turned on, so that a voltage (for example, 60% to 80% of the source voltage) which is determined by means of dividing the source voltage VB (i.e., 12 volts) at a ratio of the resistance of the resistor R1 to the combined resistance (of the resistors R2 and R3) is applied to the positive input terminal of the comparator CMP 1. Further, a voltage value (for example, 20% to 40% of the source voltage) which is determined by means of dividing the source voltage at a ratio of the combined resistance of the resistors R1 and R3 to the resistance of the resistor R2 is applied to the negative input terminal of the comparator CMP 1. A resistor of having low resistance is used for the resistor R3, and a minute difference exists between the resistance of the resistor R1 and the combined resistance (of the resistors R2 and R3).

As a result of activation of the switch SW1 and the PNP transistor Tr1, the voltage which is determined by dividing the source voltage VB (i.e., 12 volts) at a ratio of the resistance of the resistor R1 to the combined resistance (of the resistors R2 and R3) is applied to both the positive and negative input terminals of the comparator CMP 1. Since the voltage applied to the positive input terminal of the comparator CMP 1 is higher than the voltage applied to the negative input terminal of the same, a HIGH signal is output from the comparator CMP 1, thereby activating the driver circuit 2. Consequently, the driver circuit 2 outputs a HIGH gate drive signal. The HIGH gate drive signal is applied to the gate of the primary FET Q1 of the first overheat-self-interruption-type semiconductor switch QA, thereby activating the primary FET Q1. Simultaneously, the HIGH gate drive signal activates the primary FET Q3 of the second overheat-self-interruption-type semiconductor switch QB and the primary FET Q5 of the third overheat-self-interruption-type semiconductor switch QC.

In the event of a dead short circuit arising in the load L (i.e., the primary coil 21), the voltage Vds across the source and drain of the primary FET Q1 of the first overheat-self-interruption-type semiconductor switch QA becomes higher (the voltage across the drain and source of the primary FET Q1 of the first overheat-self-interruption-type semiconductor switch QA becomes higher) and stable at a voltage determined by the ON-resistance of the primary FET Q1 of the first overheat-self-interruption-type semiconductor switch QA and the short-circuit current. The first reference resistor Rr1 is set such that the source voltage applied to the primary FET Q1 of the first overheat-self-interruption-type semiconductor switch QA is higher than the source voltage applied to the primary FET Q3 of the second overheat-self-interruption-type semiconductor switch QB, given that both the FETs Q1 and Q3 continually remain in an ON state and normal. Therefore, the source voltage applied to the primary FET Q1 of the first overheat-self-interruption-type semiconductor switch QA becomes smaller than the source voltage applied to the primary FET Q3 of the second overheat-self-interruption-type semiconductor switch QB. When the primary FET Q1 of the first overheat-self-interruption-type semiconductor switch QA is usually in an ON state, the voltage Vds across the source and drain of the primary FET Q1 is 0.5 volts or thereabouts. For this reason, the source voltage applied to the primary FET Q1 of the first overheat-self-interruption-type semiconductor switch QA and the source voltage applied to the primary FET Q3 of the second overheat-self-interruption-type semiconductor switch QB are higher (closer to the source voltage) than the voltage (hereinafter referred to as a "partial voltage") determined by means of dividing the source voltage at a ratio of the resistance of the resistor R1 to the combined resistance of the resistors R2 and R3. The partial voltage is cut off by the diodes D1 and D2 and becomes irrelevant to the positive and negative input terminals of the comparator CMP 1. More specifically, the source voltage applied to the primary FET Q1 of the first overheat-self-interruption type semiconductor switch QA directly enters the positive input terminal of the comparator CMP 1, and the source voltage applied to the primary FET Q3 of the second overheat-self-interruption-type semiconductor switch QB directly enters the negative input terminal of the comparator CMP 1.

A series circuit comprising the resistor R9 and a diode D3 is connected to the positive input terminal of the comparator CMP 1. The cathode of the diode D3 is connected to a gate signal output terminal. When wires remain normal, the gate of the FET Q1 of the first overheat-self-interruption-type semiconductor switch QA is turned on. Accordingly, the cathode of the diode D3 remains at a considerably high voltage. Therefore, an electric current is cut off by the diode D3, so that no current flows through the series circuit comprising the resistor R9 and the diode D3. Further, no current flows through the resistors R5 and R6. Consequently, the source voltage applied to the primary FET Q1 of the first overheat-self-interruption-type semiconductor switch QA directly enters the positive input terminal of the comparator CMP 1, and the source voltage applied to the primary FET Q3 of the second overheat-self-interruption-type semiconductor switch QB directly enters the negative input terminal of the comparator CMP 1. The first reference resistor Rr1 is set such that the source voltage applied to the primary FET Q1 of the first overheat-self-interruption-type semiconductor switch QA is higher than the source voltage applied to the primary FET Q3 of the second overheat-self-interruption-type semiconductor switch QB, given that wires remain normal (i.e., no dead short circuit arises in the wires). Therefore, the comparator CMP 1 outputs a HIGH signal.

In the event that a short circuit arises in a path between the source of the primary FET Q1 of the first overheat-self-interruption-type semiconductor switch QA and the load L (i.e., the primary coil 21), a large current flows through the primary FET Q1 of the first overheat-self-interruption-type semiconductor switch QA. The large current flows through the ON resistance of the primary FET Q1 of the first overheat-self-interruption-type semiconductor switch QA, thus resulting in an increase in a potential difference between the drain and source of the primary FET Q1. In contrast, the primary FET Q3 of the second overheat-self-interruption-type semiconductor switch QB is made constant by the first reference resistor Rr1 and hence remains unchanged. Therefore, the source voltage applied to the primary FET Q1 of the first overheat-self-interruption-type semiconductor switch QA becomes smaller than the source voltage applied to the primary FET Q3 of the second overheat-self-interruption-type semiconductor switch QB. The comparator CMP 1 then reverses its output and outputs a LOW signal, to thereby interrupt the primary FET Q1 of the first overheat-self-interruption-type semiconductor switch QA.

When the primary FET Q1 of the first overheat-self-interruption-type semiconductor switch QA is interrupted, the source-side transistor 2a of the driver circuit 2 is deactivated, and the drain-side transistor 2b is activated. As a result, the cathode of the series circuit comprising the resistor R9 and the diode D3 is grounded, and an electric current flows through the series circuit. The electric current flows to ground in sequence from the source of the primary FET Q1 of the first overheat-self-interruption-type semiconductor switch QA, the resistor R5, the resistor R9, and the diode D3. Since the electric current flows through the resistor R5, a drop in potential is caused by the resistor R5. As a result, the voltage applied to the positive input terminal of the comparator CMP 1 is smaller than the source voltage applied to the primary FET Q1 of the first overheat-self-interruption-type semiconductor switch QA, by a value corresponding to the voltage drop across the resistor R5. This phenomenon is called hysteresis.

When the source voltage applied to the primary FET Q1 of the first overheat-self-interruption-type semiconductor switch QA has once become smaller than the source voltage applied to the primary FET Q3 of the second overheat-self-interruption-type semiconductor switch QB, the comparator CMP 1 reverses its output and outputs a LOW signal, to thereby deactivate the driver circuit 2. When the driver circuit 2 is deactivated, the source-side transistor 2a of the driver circuit 2 is deactivated, and the drain-side transistor 2b of the same is activated. As a result, an electric current flows through the series circuit comprising the resistor R9 and the diode D3, so that the voltage applied to the positive input terminal of the comparator CMP 1 becomes smaller than the source voltage actually applied to the source of the primary FET Q1 of the first overheat-self-interruption-type semiconductor switch QA. Accordingly, even if the source voltage applied to the source of the primary FET Q1 of the first overheat-self-interruption-type semiconductor switch QA becomes slightly high and fluctuates, the comparator CMP 1 stably remains in an OFF state. In short, the resistor R9 and the diode D3 constitute a hysteresis circuit.

In this state, the driver circuit 2 is turned off, and the primary FET Q1 of the first overheat-self-interruption-type semiconductor switch QA and the primary FET Q3 of the second overheat-self-interruption-type semiconductor switch QB shift to an OFF state. First, the voltage across the source and drain of the primary FET Q1 and the voltage across the source and drain of the primary FET Q3 gradually increase. In accordance with such an increase in the source and drain of the primary FET Q1 as well as an increase in the source and drain of the primary FET Q3, charges in the gate are regenerated, and a true voltage across the gate and source of the primary FET Q1 of the first overheat-self-interruption-type semiconductor switch QA and a true voltage across the gate and source of the primary FET Q3 of the second overheat-self-interruption-type semiconductor switch QB become higher, thus temporarily increasing an electric current.

However, the extent of increase in the true voltage across the gate and source of the primary FET Q1 of the first overheat-self-interruption-type semiconductor switch QA and the true voltage across the gate and source of the primary FET Q3 of the second overheat-self-interruption-type semiconductor switch QB is finite, and hence the voltages reach maximum values and cannot be increased any further after having slightly exceeded the source voltage (12 volts). The charges in the gate of the primary FET Q1 of the first overheat-self-interruption-type semiconductor switch QA and the charges in the gate of the primary FET Q3 of the second overheat-self-interruption-type semiconductor switch QB are increasingly discharged by way of a discharge circuit formed in the gate of each of the FETs Q1 and Q3. As a result, the gate voltage of each of the FETs Q1 and Q3 becomes smaller than the source voltage of each of the FETs Q1 and Q3. For these reasons, the electric current flowing through the primary FET Q1 of the first overheat-self-interruption-type semiconductor switch QA and the electric current flowing through the primary FET Q3 of the second overheat-self-interruption-type semiconductor switch QB are diminished. Simultaneously, the voltage across the source and drain of the primary FET Q1 of the first overheat-self-interruption-type semiconductor switch QA and the voltage across the source and drain of the primary FET Q3 of the second overheat-self-interruption-type semiconductor switch QB become increasingly higher.

As mentioned above, since there is a decrease in the electric current flowing through the primary FET Q1 of the first overheat-self-interruption-type semiconductor switch QA, the source-side transistor of the primary FET Q1 of the first overheat-self-interruption-type semiconductor switch QA becomes closer to ground potential. As a result, the source voltage applied to the primary FET Q1 of the first overheat-self-interruption-type semiconductor switch QA and the source voltage applied to the primary FET Q3 of the second overheat-self-interruption-type semiconductor switch QB becomes smaller than the voltage determined by means of dividing the source voltage at the ratio of the resistance of the resistor R1 to the combined resistances of the resistors R2 and R3. Consequently, no signal can be sent to the positive input terminal of the comparator CMP 1 from the source of the primary FET Q1 of the first overheat-self-interruption type semiconductor switch QA. Further, no signal can be sent to the negative input terminal of the comparator CMP 1 from the source of the primary FET Q3 of the second overheat-self-interruption-type semiconductor switch QB.

In this state, the partial voltages are applied to the positive and negative input terminals of the comparator CMP 1. The partial voltage applied to the positive input terminal of the comparator CMP 1 is higher than the partial voltage applied to the negative input terminal of the same, by only a value corresponding to the voltage drop induced by the resistor R3. The comparator CMP 1 reverses its output and produces a HIGH signal unfailingly. When the HIGH signal is output from the comparator CMP 1, the driver circuit 2 is activated again, thereby sending a gate signal to the gate of the primary FET Q1 of the first overheat-self-interruption-type semiconductor switch QA, thus activating the primary FET Q1. The electric current then flow through the load L. Such operations are performed repeatedly.

An ON/OFF counter circuit 4 becomes active when the source voltage of the primary FET Q1 of the first overheat-self-interruption-type semiconductor switch QA is higher (by 5 volts) than the ground potential, while the gate of the primary FET Q1 of the first overheat-self-interruption-type semiconductor switch QA is off and the driver circuit 2 is off; that is, while the drain-side transistor 2b of the driver circuit 2 is active. More specifically, the ON/OFF counter circuit 4 employs a CR integrating circuit, and a capacitor Cl belongs to the CR integrating circuit.

In the DC-DC converter having the foregoing configuration, when the power supply controller 1 and the MOSFET 14 are simultaneously turned on while the power MOSFETs 12 and 13 remain inactive, a DC current flows through from the battery VB to the primary coil 21 in the direction designated by arrow C, by way of the power supply controller 1. Further, the DC current flows to the ground by way of the source and drain of the MOSFET 14. As a result of activation of the power supply controller 1 and the MOSFET 14, an AC half-wave (for example, a positive half-wave) is produced. At this time, a DC current (i.e., one half-wave; for example, a positive half-wave) develops in the secondary coil 22, the voltage of the current being boosted at a rate determined by the turns ratio.

After having been activated for a predetermined period of time, the power supply controller 1 and the MOSFET 14 are deactivated. At this time, the power MOSFETS 12 and 13 are simultaneously activated through use of the gate signals output from the respective driver circuits 17 and 19. When the power MOSFETs 12 and 13 are activated, a DC current flows from the battery Vb and into the primary coil 21 in the direction designated by arrow D (in the direction opposite that in which a DC current flows when the power supply controller 1 and the MOSFET 14 are activated) by way of the source and drain of the power MOSFET 13. The DC current finally flows to ground by way of the drain and source of the MOSFET 12. As a result of activation of the power MOSFETs 12 and 13, a DC current flows in the direction opposite to that in which a DC current flows when the power supply controller 1 and the MOSFET 14 are activated, thereby inducing in the secondary coil 22 a DC current whose lowered voltage is determined by a turns ratio (i.e., the remaining half-wave; for example, a negative half-wave). As a result of continuous generation of the two types of half-waves, a DC current is converted into an AC current.

After the power MOSFETs 12 and 13 have been activated for a predetermined period of time, the power supply controller 1 and the MOSFET 14 are turned on for another predetermined period of time. Thus, activation and deactivation of the power supply controller 1 and the MOSFET 14 and activation and deactivation of the power MOSFETs 12 and 13 are carried out alternately, thereby enabling an AC current having a lowered voltage to arise in the secondary coil 22. The AC current induced in the secondary coil 22 is subjected to half-wave rectification (i.e., rectification of positive half-waves) by the half-wave rectification circuit 23, and the thus-rectified half-waves are smoothed by the smoothing circuit 24, thereby withdrawing a DC voltage having a predetermined and lowered voltage.

In a case where an anomaly, such as a short circuit arising in a secondary circuit, is detected, a large current flows through the circuit of the power supply controller 1. In this way, occurrence of an anomaly can be detected by a large current flowing through the circuit of the power supply controller 1.

In the present invention, a circuit can be protected from a large current, which would otherwise be caused by a short circuit or a like failure, without use of a fuse. Even if a circuit is protected from a large current at the time of a short circuit, reactivation of the circuit does not involve maintenance. The diameter of a wire harness is reduced, thus saving the weight of the wire hardness.

In the present invention, a circuit can be protected from a large current, which would otherwise be caused by a short circuit or a like failure, without use of a fuse. Even if a circuit is protected from a large current at the time of a short circuit, reactivation of the circuit does not involve maintenance. The diameter of a wire harness is reduced, thus saving the weight of the wire hardness. Further, the present invention enables not detection of complete short circuit (i.e., a dead short) but facilitated detection of an incomplete short circuit (i.e., a rare short).

In the present invention, a circuit can be protected from a large current, which would otherwise be caused by a short circuit or a like failure, without use of a fuse. Even if a circuit is protected from a large current at the time of a short circuit, reactivation of the circuit does not involve maintenance. The diameter of a wire harness is reduced, thus saving the weight of the wire hardness. Further, the present invention enables determination as to whether or not the flow of a large current is ascribable to a complete short circuit (i.e., a dead short) or another, temporary reason.

What is claimed is:

1. A fuseless DC-DC converter comprising:
   a load circuit formed including a first overheat self-interruption-type semiconductor switch connected in series between a DC power supply and a load;
   a reference circuit including a second overheat self-interruption-type semiconductor switch connected in parallel with the first overheat self-interruption-type semiconductor switch, and a reference resistor having one end connected to the source of the second overheat self-interruption-type semiconductor switch and the other end is grounded, said reference circuit inducing, across the drain and source of the second overheat self-interruption-type semiconductor switch, the same voltage as that arising across the drain and source of the second overheat self-interruption-type semiconductor switch when a constant load current flows through the first overheat self-interruption-type semiconductor switch;

a comparator circuit comparing the source voltage of the first overheat self-interruption-type semiconductor switch with a reference voltage applied to the source of the second overheat self-interruption-type semiconductor switch, and a power supply controller for deactivating the first overheat self-interruption-type semiconductor switch when said controller judges a current greater than a predetermined value flows through the first overheat self-interruption-type semiconductor switch on the basis of the result of the comparison performed by the comparator circuit, for controlling activation or deactivation of the first overheat self-interruption-type semiconductor switch by a predetermined duty cycle under predetermined conditions, for judging an occurrence of an abnormal condition in the load circuit, when the activation and deactivation of the first overheat self-interruption-type semiconductor switch has continued for a predetermined amount of time, to interrupt the first overheat self-interruption-type semiconductor switch so as to suspend power supply to the load.

2. The fuseless DC-DC converter as defined in claim 1, wherein the predetermined conditions are defined by the condition that the first overheat-self-interruption-type semiconductor switch is deactivated from on-state when the voltage across the drain and source of the first overheat-self-interruption-type semiconductor switch has become smaller than a threshold voltage set to 60% to 80% the source voltage and when the source voltage of the first overheat-self-interruption-type semiconductor switch has become higher than the source voltage of the second overheat-self-interruption-type semiconductor switch, and that the first overheat-self-interruption-type semiconductor switch is activated from off-state when the voltage across the drain and source of the first overheat-self-interruption-type semiconductor switch has become higher than a threshold voltage set to 60% to 80% the source voltage.

3. The fuseless DC-DC converter as defined in claim 1, wherein the power supply controller includes a forceful driver circuit which forcefully activates the first overheat-self-interruption-type semiconductor switch by application a partial voltage which is obtained by division of the source voltage to the comparator circuit when a potential difference across the drain and source of the first overheat-self-interruption-type semiconductor switch increased by an internal resistor of the first overheat-self-interruption-type semiconductor switch reaches to a predetermined voltage difference, after the first overheat-self-interruption-type semiconductor switch has been deactivated on the basis of an output of the comparator circuit upon an occurrence of an abnormal condition in the load circuit.

4. The fuseless DC-DC converter as defined in claim 2, wherein the power supply controller includes a forceful driver circuit which forcefully activates the first overheat-self-interruption-type semiconductor switch by application a partial voltage which is obtained by division of the source voltage to the comparator circuit when a potential difference across the drain and source of the first overheat-self-interruption-type semiconductor switch increased by an internal resistor of the first overheat-self-interruption-type semiconductor switch reaches to a predetermined voltage difference, after the first overheat-self-interruption-type semiconductor switch has been deactivated on the basis of an output of the comparator circuit upon an occurrence of an abnormal condition in the load circuit.

\* \* \* \* \*